United States Patent
Nishimura et al.

(10) Patent No.: US 7,233,073 B2
(45) Date of Patent: Jun. 19, 2007

(54) SEMICONDUCTOR DEVICE AND METHOD FOR FABRICATING THE SAME

(75) Inventors: Atsushi Nishimura, Osaka (JP); Toru Hinomura, Osaka (JP); Atsushi Ikeda, Niigata (JP); Takenobu Kishida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 263 days.

(21) Appl. No.: 10/830,134

(22) Filed: Apr. 23, 2004

(65) Prior Publication Data

US 2005/0023702 A1 Feb. 3, 2005

(30) Foreign Application Priority Data

Jul. 31, 2003 (JP) ............... 2003-283415

(51) Int. Cl.
 *H01L 23/48* (2006.01)
(52) U.S. Cl. .............. 257/774; 257/E23.011
(58) Field of Classification Search ............... None
See application file for complete search history.

(56) References Cited

U.S. PATENT DOCUMENTS 6,375,552 B1 * 4/2002 Cadien et al. ............ 451/41
2003/0062626 A1 * 4/2003 Bhowmik et al. ......... 257/774
2003/0075802 A1 * 4/2003 Derraa et al. ............. 257/758
2003/0162407 A1 * 8/2003 Maex et al. .............. 438/725

FOREIGN PATENT DOCUMENTS

| JP | 08-017927 | 1/1996 |
| JP | 11-087272 | 3/1999 |
| JP | 2001-60564 A | 3/2001 |
| JP | 2002-146531 | 5/2002 |
| JP | 2003-022985 | 1/2003 |

* cited by examiner

*Primary Examiner*—Leonardo Andujar
*Assistant Examiner*—Krista Soderholm
(74) *Attorney, Agent, or Firm*—McDermott Will & Emery LLP

(57) ABSTRACT

After forming a hole in an insulating film, a first tungsten film is formed over the wall and bottom surfaces of the hole. Then, a second tungsten film is formed by using the first tungsten film as a seed layer to fill up the hole. When the first tungsten film is formed, the average value of the diameters of crystal grains of the portion of the first tungsten film which is formed on the bottom surface of the hole is suppressed to 30 nm or less.

4 Claims, 10 Drawing Sheets

|—————|
0.1 μm

SiH₄ Flow Rate:5mL/min

SiH₄ Flow Rate:30mL/min

SEMICONDUCTOR DEVICE AND METHOD FOR FABRICATING THE SAME

BACKGROUND OF THE INVENTION

The present invention relates to a semiconductor device and a method for fabricating the same and, more particularly, to a semiconductor device in which a tungsten plug is provided on a semiconductor element or a wire and a method for fabricating the same.

Conventionally, a tungsten plug provided to extend through an insulating film has been used as an electrode for supplying a current and a signal to a semiconductor element or a lower layer wire covered with the insulating film (see, e.g., Japanese Laid-Open Patent Publication No. 2001-60564).

FIG. 9 shows a cross-sectional structure of a conventional semiconductor device having a tungsten plug. As shown in FIG. 9, an insulating film 102 made of a silicon oxide is formed on a semiconductor substrate 101 made of silicon and having an upper surface provided with a semiconductor integrated circuit (not shown) including a semiconductor element and the like. The insulating film 102 is formed with a contact hole 102a reaching the semiconductor element. A titanium film 103, a titanium nitride film 104, and a first tungsten film 105 are stacked successively in layers on a wall surface of the contact hole 102a. A second tungsten film 106 is provided on the first tungsten film 105 in such a manner as to fill up the inside of the contact hole 102a.

In the conventional semiconductor device, the first tungsten film 105 has the function as a seed layer for the crystal growth of the second tungsten film 106 serving as the main body portion of the plug in the contact hole 102a, while each of the titanium film 103 and the titanium nitride film 104 has the function as an adhesion layer for enhancing the adhesion between the first tungsten film 105 and the insulating film 102.

In a method for fabricating the conventional semiconductor device, the insulating film 102 is formed first on the semiconductor substrate 101 and then the contact hole 102a is formed in the insulating film 102. Then, the titanium film 103 and the titanium nitride film 104 are deposited successively over the entire surface of the insulating film 102 so that the wall surface and the bottom surface (i.e., the upper surface of the semiconductor substrate 101 exposed at the bottom of the contact hole 102a) of the contact hole 102a is covered with the titanium film 103 and the titanium nitride film 104.

Next, the first tungsten film 105 is formed on the titanium nitride film 104 by CVD (chemical vapor deposition) using the reduction of a tungsten fluoride by a silicon hydride such that the contact hole 102a is halfway filled therewith. Subsequently, the second tungsten film 106 is formed on the first tungsten film 105 by CVD using the reduction of a tungsten fluoride by hydrogen such that the contact hole 102a is filled up completely therewith.

Thereafter, the respective portions of the second tungsten film 106, the first tungsten film 105, the titanium nitride film 104, and the titanium film 103 located outside the contact hole 102a, i.e., the respective portions of the second tungsten film 106, the first tungsten film 105, the titanium nitride film 104, and the titanium film 103 deposited over the insulating film 102 are removed successively by CMP (chemical mechanical polishing), whereby a plug composed of the first tungsten film 105 and the second tungsten film 106 is formed in the contact hole 102a.

In accordance with the method for fabricating the conventional semiconductor device, however, a problem is encountered that a tungsten-film burying defect occurs to form a seam (void) 107 in the contact hole 102, as shown in FIG. 10, which leads to the degradation of the reliability of the semiconductor device resulting from the defect. The problem becomes more pronounced with the miniaturization of the contact hole or with the increase of the aspect ratio thereof.

SUMMARY OF THE INVENTION

In view of the foregoing, it is therefore an object of the present invention to enable the formation of a defectfree tungsten plug even in a miniaturized hole.

To attain the object, the present inventors have examined factors causing the seam in the tungsten plug mentioned above and made the following findings.

The first finding is that the coverage of the first tungsten film 105 degrades with the increase of the aspect ratio (the ratio of the depth of the contact hole 102a to the opening diameter thereof) of the contact hole 102a. This accelerates the deposition of the first tungsten film 105 at the opening portion of the contact hole 102a (i.e., at the upper surface of the insulating film 102) rather than at the lower portion of the contact hole 102a. As a result, the first tungsten film 105 is formed disadvantageously to overhang from the peripheral edge of the opening portion of the contact hole 102a toward the center thereof, as shown in FIG. 11. When the second tungsten film 106 is deposited by using the first tungsten film 105 as the seed layer, the second tungsten film 106 clogs the opening portion of the contact hole 102a before the second tungsten film 106 is filled in the inside of the contact hole 102a.

That second finding is that, although the first tungsten film 105 is formed as a polycrystalline material composed of extremely small particles (grains) by the CVD described above, the diameter of each of the grains (grain size) of the first tungsten film 105 formed at the bottom surface of the contact hole 102a is significantly increased if the contact hole 102a is miniaturized to have a diameter of 0.18 µm or less, in particular. Consequently, of the second tungsten film 106 deposited by using the first tungsten film 105 as the seed layer, the portion covering the bottom surface of the contact hole 102a is difficult to form with a columnar structure and it becomes difficult to sufficiently to fill up the contact hole 102a with the second tungsten film 106.

Thus, the degraded coverage of the first tungsten film 105 and the increased grain size of the first tungsten film 105 at the bottom surface of the hole become pronounced with the miniaturization of the semiconductor device, i.e., with the increase of the aspect ratio of the contact hole 102a so that it becomes difficult to form the second tungsten film 106 with excellent morphology. As a result, a defect such as the enlargement of the seam 107 occurs in the plug composed of the first tungsten film 105 and the second tungsten film 106 and degrades the reliability of the semiconductor device.

The present inventors have conceived the invention which suppresses, in a method for fabricating a semiconductor device comprising a first tungsten film serving as a seed layer and a second tungsten film composing a main body portion of a plug, the average value of the crystal grain diameters of the portion of the first tungsten film which is formed on the bottom surface of a hole for plug formation to 30 nm or less.

Specifically, a method for fabricating a semiconductor device according to the present invention assumes a method which buries a tungsten plug in a hole provided in an insulating film, the method comprising the steps of: forming a first tungsten film composing the tungsten plug over a wall surface of the hole and a bottom surface thereof, and forming a second tungsten film composing the tungsten plug by using the first tungsten film as a seed layer and thereby filling up the hole therewith, the step of forming the first tungsten film includes suppressing an average value of diameters of crystal grains of a portion of the first tungsten film which is formed at a bottom surface of the hole to 30 nm or less.

Since the method for fabricating a semiconductor device according to the present invention suppresses the average value of the diameters of the crystal grains of the portion of the first tungsten film covering the bottom surface of the hole to 30 nm or less in forming the first tungsten serving as the seed layer, the second tungsten film with excellent morphology can be formed even in the hole with a high aspect ratio by using the first tungsten film as the seed layer. This reduces defects such as a seam in the plug composed of the first and second tungsten films buried in the hole and allows the fabrication of a semiconductor device with high reliability.

Preferably, the method for fabricating a semiconductor device according to the present invention further comprises, prior to the step of forming the first tungsten film, the steps of: forming an adhesion layer over the wall and bottom surfaces of the hole; and performing a heat treatment with respect to the adhesion layer to clean a surface of the adhesion layer, wherein the first tungsten film is formed on the cleaned surface of the adhesion layer.

The arrangement enables the removal of an unpreferable degraded portion or contamination that has occurred in the surface portion of the adhesion layer over the bottom surface of the hole and proper reformation of the adhesion layer into an underlying layer for forming the first tungsten film thereon. As a result, the first tungsten film can be formed also over the adhesion layer on the bottom surface of the hole such that the average value of the crystal grain diameters is controlled reliably to 30 nm or less. This allows the second tungsten film with excellent morphology to be formed reliably even in the hole having a high aspect ratio and allows a low-defect tungsten plug to be formed reliably In the case of performing the foregoing heat treatment (cleaning of the adhesion layer), the step of performing the heat treatment and the step of forming the first tungsten film are preferably performed continuously in the same reaction chamber without opening the reaction chamber to an atmosphere.

The arrangement eliminates the risk that, after the surface of the adhesion layer is cleaned, it is contaminated again by the time the first tungsten film is formed. In this case, if the step of performing the heat treatment includes the step of introducing a heat treatment gas into the reaction chamber, raising a temperature in the reaction chamber over a specified period, and then exhausting the heat treatment gas from the reaction chamber, contamination on the surface of the adhesion layer or the like is removed reliably by using the heat treatment gas and the adhesion layer can be reformed properly into an underlying layer for forming the first tungsten film thereon. As the heat treatment gas, a gas mixture of, e.g., an argon gas and a hydrogen gas is used preferably. The arrangement allows reliable removal of contamination or the like occurred in the surface of the adhesion layer, while preventing the oxidation of the surface of the adhesion layer, so that the performance of the semiconductor device is no more degraded by the heat treatment.

In the method for fabricating a semiconductor device according to the present invention, the step of forming the first tungsten film may be performed by CVD using a tungsten fluoride gas and a silicon hydride gas as raw material gases. In this case, a ratio of a flow rate of the tungsten fluoride gas to a flow rate of the silicon hydride gas is preferably set to 8.4 or more. The arrangement increases the deposition rate of the first tungsten film up to a reaction-rate determined range and enables reliable formation of the first tungsten film with excellent coverage.

In the method for fabricating a semiconductor device according to the present invention, the step of forming the second tungsten film may be performed by CVD using a tungsten fluoride gas and a hydrogen gas as raw material gases. In this case, a ratio of a flow rate of the tungsten fluoride gas to a flow rate of the hydrogen gas is preferably set to 0.24 or more. The arrangement increases the deposition rate of the second tungsten film up to a reaction-rate determined range and enables reliable formation of a low-defect plug with a reduced seam.

In the method for fabricating a semiconductor device according to the present invention, when the adhesion layer is formed over the wall and bottom surfaces of the hole prior to the formation of the first tungsten film, the adhesion layer is preferably a multilayer film composed of a titanium film and a titanium nitride film which are stacked successively in layers. The arrangement positively enhances the adhesion between the insulating film and the first tungsten film.

A semiconductor device according to the present invention assumes a semiconductor device comprising a tungsten plug buried in a hole provided in an insulating film, a portion of the tungsten plug which is formed on a bottom surface of the hole having a columnar structure, an average value of a diameter of a bottom portion of the columnar structure being 30 nm or less.

Since the semiconductor device according to the present invention is obtainable in accordance with the method for fabricating a semiconductor device according to the present invention, defects such as a seam in the tungsten plug can be reduced and the reliability of the semiconductor device can be increased.

In the semiconductor device according to the present invention, an adhesion layer composed of, e.g., a multilayer film composed of a titanium film and a titanium nitride film is preferably provided between the insulating film and the tungsten plug.

The arrangement positively enhances the adhesion between the tungsten film composing the tungsten plug and the insulating film.

The effects of the present invention described above are achieved remarkably when the opening diameter of the hole for plug formation is 0.18 μm or less, particularly when the present invention is applied to a hole for plug formation having an opening diameter of 0.11 μm assumed in a next-generation semiconductor device.

The semiconductor device according to the present invention and the fabrication method therefor also have the marked effect of allowing the formation of the low-defect tungsten plug in the hole with a high aspect ratio provided in the insulating film so that they are useful as a semiconductor device having a tungsten plug and a fabrication method therefor.

BRIEF DESCRIPTION OF THE DRAWINGS

FIGS. 5A and 5B show the electron photomicrographs of a contact hole obtained at a time point after the formation of the first tungsten film in the method for fabricating the semiconductor device according to the embodiment, of which FIG. 5A shows the case where the flow rate of a silicon hydride gas used to form the first tungsten film is 5 mL/min (standard conditions) and FIG. 5B shows the case where the flow rate thereof is 30 mL/min (standard conditions);

DETAILED DESCRIPTION OF THE INVENTION

Figure 1:
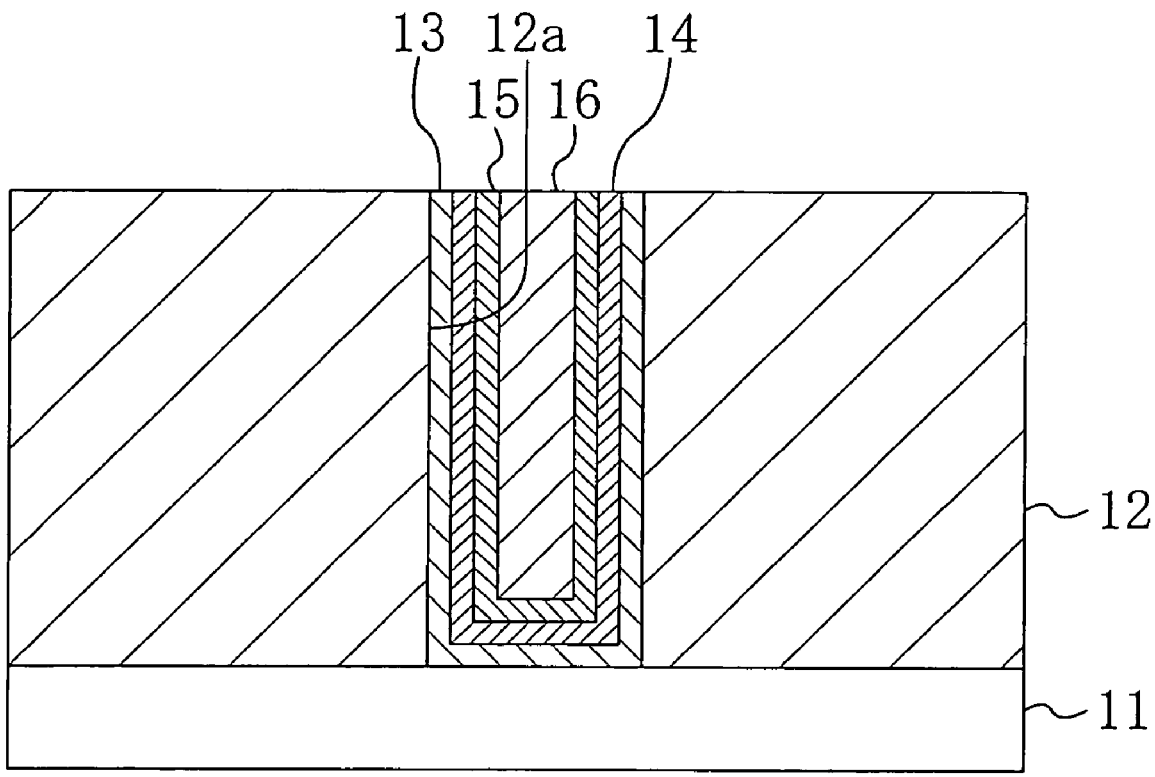
FIG. 1 is a cross-sectional view of a semiconductor device according to an embodiment of the present invention.

Referring now to the drawings, a semiconductor device according to an embodiment of the present invention and a fabrication method therefor will be described with reference to the drawings.

FIG. 1 shows a cross-sectional structure of the semiconductor device according to the embodiment of the present invention. As shown in FIG. 1, an insulating film 12 made of, e.g., a silicon oxide and having a thickness of about 1.5 µm is deposited on a semiconductor substrate 11 made of, e.g., silicon and having an upper surface provided with a semiconductor integrated circuit (not shown) including a semiconductor element and the like. The insulating film 12 is provided with a contact hole 12a reaching a portion of the upper surface of the semiconductor substrate 11, e.g., the semiconductor element. In the present embodiment, the diameter of the opening portion of the contact hole 12a is about 0.18 µm. A titanium film 13 with a thickness of, e.g., about 5.5 nm, a titanium nitride film 14 with a thickness of, e.g., about 11 nm, and a first tungsten film 15 with a thickness of, e.g., about 17 nm are formed in this order over the wall surface and the bottom surfaces (i.e., the upper surface of the portion of the semiconductor substrate 11 located below the contact hole 12a) of the contact hole 12a. A second tungsten film 16 is further provided on the first tungsten film 15 to fill up the inside of the contact hole 12a.

It is to be noted that the first tungsten film 15 and the second tungsten film 16 buried in the contact hole 12a are connected electrically to the semiconductor element on the semiconductor substrate 11. In other words, the first tungsten film 15 and the second tungsten film 16 compose a plug for extracting the electrode of the semiconductor element to the upper surface of the insulating film 12.

On the other hand, each of the titanium film 13 and the titanium nitride film 14 functions as an adhesion layer for enhancing the adhesion between the tungsten films (i.e., the first tungsten film 15 and the second tungsten film 16) composing the plug and the insulating film 12.

As the first tungsten film 15, a tungsten film formed through the reduction of a tungsten fluoride ($WF_6$) by a silicon hydride ($SiH_4$) is used, while a tungsten film formed through the reduction of the tungsten fluoride by hydrogen ($H_2$) is used as the second tungsten film 16.

The semiconductor device according to the present embodiment is characterized in that the average value of the grain size of the first tungsten film 15 is suppressed to 30 nm or less at the bottom surface of the contact hole 12a having a high aspect ratio (specifically, the diameter is about 0.18 µm, the depth is about 1.5 µm, and the aspect ratio is about 8). This enables the formation of the second tungsten film 16 with excellent morphology on the first tungsten film 15 and allows the first and second tungsten films 15 and 16 in the contact hole 12a to be used as a low-defect plug with a reduced seam. Although the first and second tungsten films 15 and 16 are actually integrated with each other when the second tungsten film 16 is formed by using the first tungsten film 15 as a seed layer, the portion of the integral tungsten film formed on the bottom surface of the contact hole 12a has a columnar structure and the average value of the diameter of the bottom portion of the columnar structure is 30 nm or less.

A description will be given herein below to a method for fabricating a semiconductor device according to the embodiment, i.e., the semiconductor device shown in FIG. 1.

FIGS. 2A to 2E are cross-sectional views illustrating the individual process steps of the method for fabricating the semiconductor device according to the embodiment.

Figure 2A:
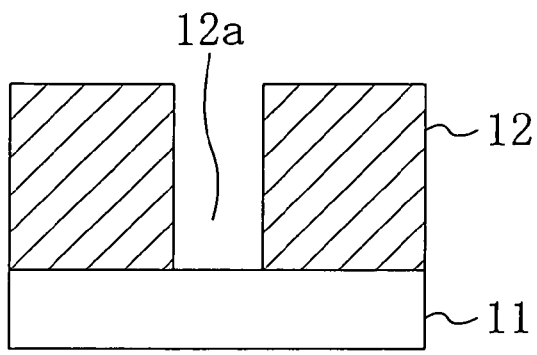
FIGS. 2A to 2E are cross-sectional views illustrating the individual process steps of a method for fabricating the semiconductor device according to the embodiment.

First, as shown in FIG. 2A, the insulating film 12 made of, e.g., a silicon oxide is deposited by, e.g., chemical vapor deposition (CVD) or the like on the semiconductor substrate 11 having an upper surface provided with the semiconductor integrated circuit (not shown) including the semiconductor element and the like. Subsequently, the insulating film 12 is patterned by photolithography and dry etching such that the contact hole 12a having a diameter of about 0.18 µm and a depth of about 1.5 µm is formed to reach the semiconductor element on the semiconductor substrate 11.

Figure 2D:
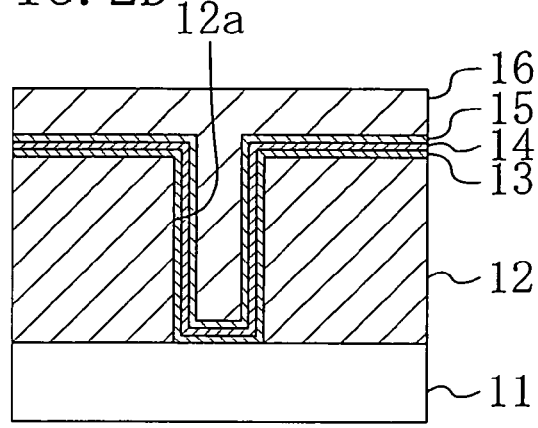
Figure 2B:
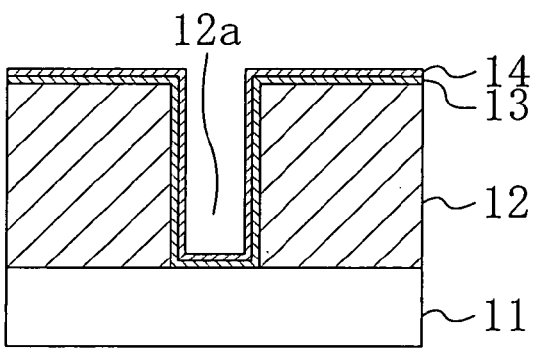

Next, as shown in FIG. 2B, the titanium film 13 with a thickness of, e.g., about 5.5 nm and the titanium nitride film 14 with a thickness of, e.g., about 11 nm are deposited successively over the entire surface of the insulating film 12 by, e.g., CVD or the like. As a result, the wall and bottom (the upper surface of the semiconductor substrate 11 exposed in the contact hole 12a) surfaces of the contact hole 12a are covered with a multilayer film consisting of the titanium film 13 and the titanium nitride film 14, i.e., the adhesion layer.

Then, the semiconductor substrate 11 formed with the insulating film 12, the titanium film 13, and the titanium nitride film 14 is placed in the reaction chamber of a CVD system for forming, e.g., a tungsten film and a gas for heat treatment under a pressure of about $1.2 \times 10^4$ Pa (about 90 Torr) is introduced into the reaction chamber. Thereafter, a temperature in the reaction chamber is raised to about 450° C. to perform a heat treatment with respect to the surface of the titanium nitride film 14. As the gas for heat treatment, a gas mixture of, e.g., an argon (Ar) gas at a flow rate of about 2800 mL/min (standard conditions) and a hydrogen ($H_2$) gas at a flow rate of about 1000 mL/min (standard conditions) is used. After the heat treatment is performed with respect to the semiconductor substrate 11 for, e.g., about 30 seconds, the gas for heat treatment is exhausted from the reaction chamber over a period of, e.g., about 30 seconds.

The heat treatment allows the surface of the titanium nitride film 14 to be reformed into an underlie suitable for the growth of the first tungsten film 15 thereon. The specific effect of the heat treatment will be described later.

Next, a first raw material gas is introduced into the reaction chamber of the CVD system described above and, as shown in FIG. 2C, the first tungsten film 15 with a thickness of about 17 nm is formed over the titanium nitride film 14 to halfway fill the contact hole 12a under such conditions that the temperature is, e.g., about 450° C. and the pressure is about $4.0 \times 10^3$ Pa (about 30 Torr). As the first raw material gas for forming the first tungsten film 15, a gas mixture of, e.g., a tungsten fluoride ($WF_6$) gas at a flow rate of about 42 mL/min (standard conditions) and a silicon hydride ($SiH_4$) gas at a flow rate of about 5 mL/min (standard conditions) is used. This allows the first tungsten film 15 to be formed with excellent coverage, while preventing the overhang at the opening portion of the contact hole 12a. Since the titanium nitride film 14 serving as the underlie in forming the first tungsten film 15 has been reformed suitably for the growth of the first tungsten film 15 thereon by the foregoing heat treatment, the average value of the grain size of the first tungsten film 15 can be suppressed to 30 nm or less even at the bottom surface of the contact hole 12a.

Preferably, the step of forming the first tungsten film 15 is performed by continuously introducing the first raw material gas without opening the reaction chamber to an atmosphere after exhausting the heat treatment gas from the reaction chamber of the CVD system in the heat treatment step described above. The arrangement eliminates the risk that the surface of the titanium nitride film 14 reformed by the heat treatment is contaminated again or degraded and thereby ensures a reduction in the grain size of the first tungsten film 15.

Then, a second raw material gas is introduced into the reaction chamber of the foregoing CVD system and, as shown in FIG. 2D, the second tungsten film 16 with a thickness of about 200 nm is formed over the first titanium film 15 to completely fill up the contact hole 12a under such conditions that the temperature is, e.g., about 450° C. and the pressure is about $1.2 \times 10^4$ Pa (about 90 Torr). As the second raw material gas for forming the second tungsten film 16, a gas mixture of, e.g., a tungsten fluoride gas at a flow rate of about 120 mL/min (standard conditions) and a hydrogen ($H_2$) gas at a flow rate of about 500 mL/min (standard conditions) is used. Since the average value of the grain size of the first tungsten film 15 serving as the underlie in forming the second tungsten film 16 has been suppressed to 30 nm or less even at the bottom surface of the contact hole 12a, the second tungsten film 16 can be formed with excellent morphology.

Figure 2E:
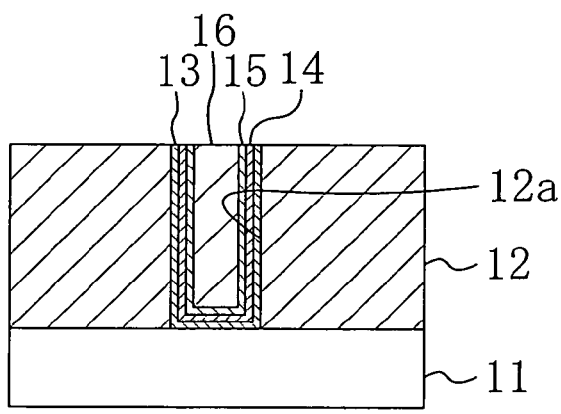
Figure 2C:
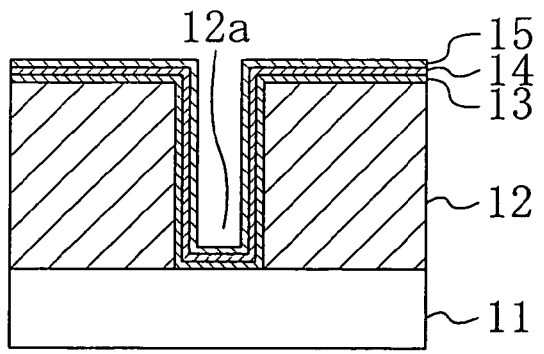

Next, as shown in FIG. 2E, the respective portions of the second tungsten film 16, the first tungsten film 15, the titanium nitride film 14, and the titanium film 13 located outside the contact hole 12a, i.e., the respective portions of the second tungsten film 16, the first tungsten film 15, the titanium nitride film 14, and the titanium film 13 located above the upper surface of the insulating film 12 are removed successively by chemical mechanical polishing (CMP), whereby the semiconductor device according to the present embodiment shown in FIG. 1 is completed.

Thus, in forming the first tungsten film 15 serving as the seed layer, the present embodiment can suppress the average value of the grain size of the first tungsten film 15 to 30 nm or less even at the bottom surface of the contact hole 12a. Even when the contact hole 12a has a high aspect ratio, therefore, the second tungsten film 16 with excellent morphology can be formed in the contact hole 12a by using the first tungsten film 15 as a seed layer. This reduces defects such as a seam in the plug composed of the first tungsten film 15 and the second tungsten film 16 buried in the contact hole 12a and thereby allows the fabrication of a semiconductor device with high reliability.

The effect of the present embodiment described above is extremely marked when the opening diameter of the hole for plug formation is 0.18 μm or less, particularly when the present embodiment is applied to a hole for plug formation having an opening diameter of 0.11 μm assumed in a next-generation semiconductor device.

Figure 3:
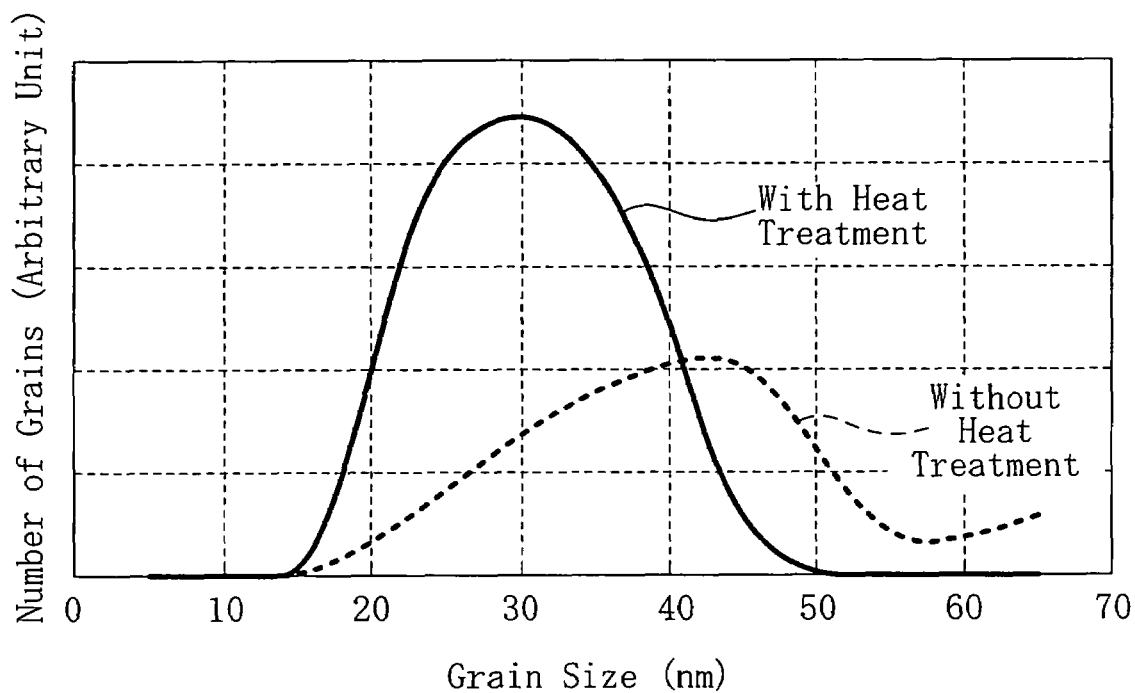
FIG. 3 is a view for illustrating the effect of a heat treatment performed with respect to an adhesion layer in the method for fabricating the semiconductor device according to the embodiment.

FIG. 3 is a view for illustrating the effect of the foregoing heat treatment exerted on the adhesion layer (titanium nitride layer 14) in the method for fabricating the semiconductor device according to the embodiment. Specifically, FIG. 3 shows the distribution of the grain size of the first tungsten film 15 (the portion of the first tungsten film 15 formed on the bottom surface of the contact hole 12a) when the heat treatment was performed in comparison with the distribution of the grain size thereof when the heat treatment was not performed. In FIG. 3, the abscissa represents the grain size of the first tungsten film 15 and the ordinate represents the number of grains, while the solid curve represents the distribution of the grain size when the heat treatment was performed and the broken curve represents the grain size when the heat treatment was not performed.

As shown in FIG. 3, the average value and variation of the grain size of the tungsten film 15 formed after the heat treatment was performed with respect to the titanium nitride film 14 serving as the underlie of the first tungsten film 15 are smaller than those of the first tungsten film 15 formed without performing the heat treatment. Specifically, the grain size of the first tungsten film 15 formed after the foregoing heat treatment has an average value of about 26 nm, a standard deviation σ of about 5.8 nm, a minimum value of about 5 nm, and a maximum value of about 65 nm. By contrast, the grain size of the tungsten film formed without performing the foregoing heat treatment has an average value of about 37 nm and a standard deviation σ of about 10.8 nm. By thus performing the heat treatment with respect to the titanium nitride film 14, the average value of the grain size of the first tungsten film 15 can be suppressed to 30 nm or less even at the bottom surface of the contact hole 12a, while the variation of grain size is reduced.

Although the cause-and-effect-relationship between the heat treatment performed with respect to the titanium nitride film 14 and a reduction in the grain size of the first tungsten film 15 has not been elucidated in the present embodiment, it is presumed by the present inventors as follows. That is, the foregoing heat treatment can conceivably remove any degradation, contamination, or the like that might have occurred in the surface of the titanium nitride film 14 during the period from the time the formation of the titanium nitride film 14 is completed until the formation of the first tungsten film 15 is initiated and thereby allows the surface of the titanium nitride film 14 to be reformed into an underlie suitable for the formation of the first tungsten film 15 thereon. Preferably, the average grain size of the first tungsten film 15 at the bottom surface of the contact hole 12a can further be suppressed to a value smaller than 30 nm in step with the further miniaturization of a semiconductor device, i.e., with the further miniaturization of the contact hole 12a and the further increase of the aspect ratio thereof.

A description will be given herein below to the result of examining specific conditions in the respective steps of forming the first and second tungsten films 15 and 16 in the method for fabricating the semiconductor device according to the present embodiment.

A detailed description will be given first to the result of examining specific conditions for suppressing the average value of the grain size of the first tungsten film 15 to 30 nm or less even at the bottom surface of the contact hole 12a with reference to the drawings.

Figure 4:
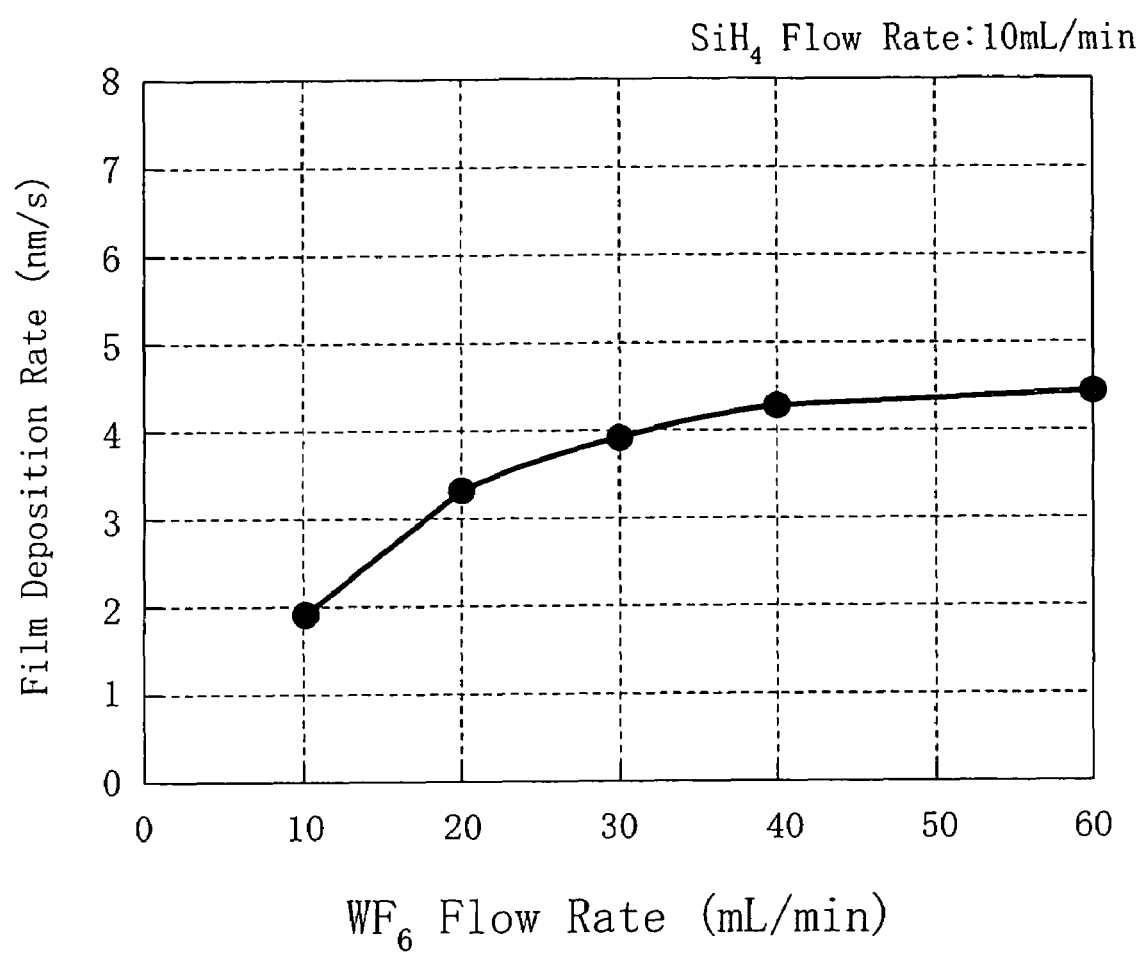
FIG. 4 is a view showing a relationship between the flow rate of a tungsten fluoride gas used to form a first tungsten film and the deposition rate of the first tungsten film in the method for fabricating the semiconductor device according to the embodiment.

FIG. 4 is a graph showing the relationship between the flow rate of the tungsten fluoride gas composing the first raw material gas used in the step of forming the first tungsten film 15 and the deposition rate of the first tungsten film 15 in the method for fabricating the semiconductor device according to the embodiment. In FIG. 4, the abscissa represents the flow rate of the tungsten fluoride gas and the ordinate represents the deposition rate of the first tungsten film 15. Each of the data sets shown in FIG. 4 was obtained from the measurement performed by fixing the flow rate of the silicon hydride gas composing the first raw material gas to about 10 mL/min (standard conditions).

As shown in FIG. 4, the deposition rate of the first tungsten film 15 increases as the flow rate of the tungsten fluoride gas composing the first raw material gas increases. However, the deposition rate of the first tungsten film 15 barely increases after the flow rate reaches about 42 mL/min (standard conditions). It will therefore be understood that the first tungsten film 15 can be formed in a reaction-rate determined range by setting the flow rate of the tungsten fluoride gas composing the first raw material gas to about 42 mL/min (standard conditions) or more.

Figure 5A:
Figure 5B:
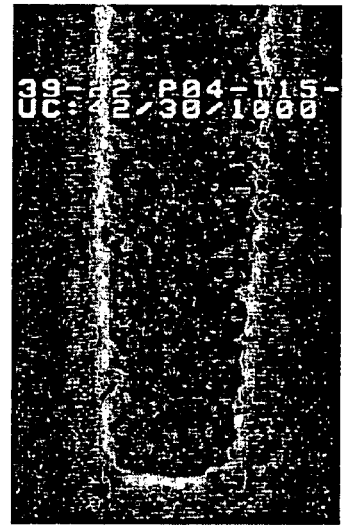

FIGS. 5A and 5B show the electron micrographs of the contact holes 12a obtained at a time point after the formation of the first tungsten film 15 in the method for fabricating the semiconductor device according to the embodiment, of which FIG. 5A shows the case where the flow rate of the silicon hydride gas composing the first raw material gas is 5 mL/min (standard conditions) and FIG. 5B shows the case where the flow rate of the silicon hydride gas composing the first raw material gas is 30 mL/min (standard conditions). Each of the data sets shown in FIGS. 5A and 5B was obtained by fixing the flow rate of the tungsten fluoride gas composing the first raw material gas to about 42 mL/min (standard conditions).

As shown in FIG. 5A, when the flow rate of the silicon hydride gas is about 5 mL/min (standard conditions), the first tungsten film 15 is formed to have a substantially intended thickness even at the bottom surface of the contact hole 12a. When the flow rate of the silicon hydride gas is about 30 mL/min (standard conditions) as shown in FIG. 5B, on the other hand, the thickness of the first tungsten film 15 at the bottom surface of the contact hole 12a is smaller than the intended value. This proves that, as the flow rate of the silicon hydride gas composing the first raw material gas is lower, the bottom coverage of the first tungsten film 15 in the contact hole 12a is higher.

Figure 6:
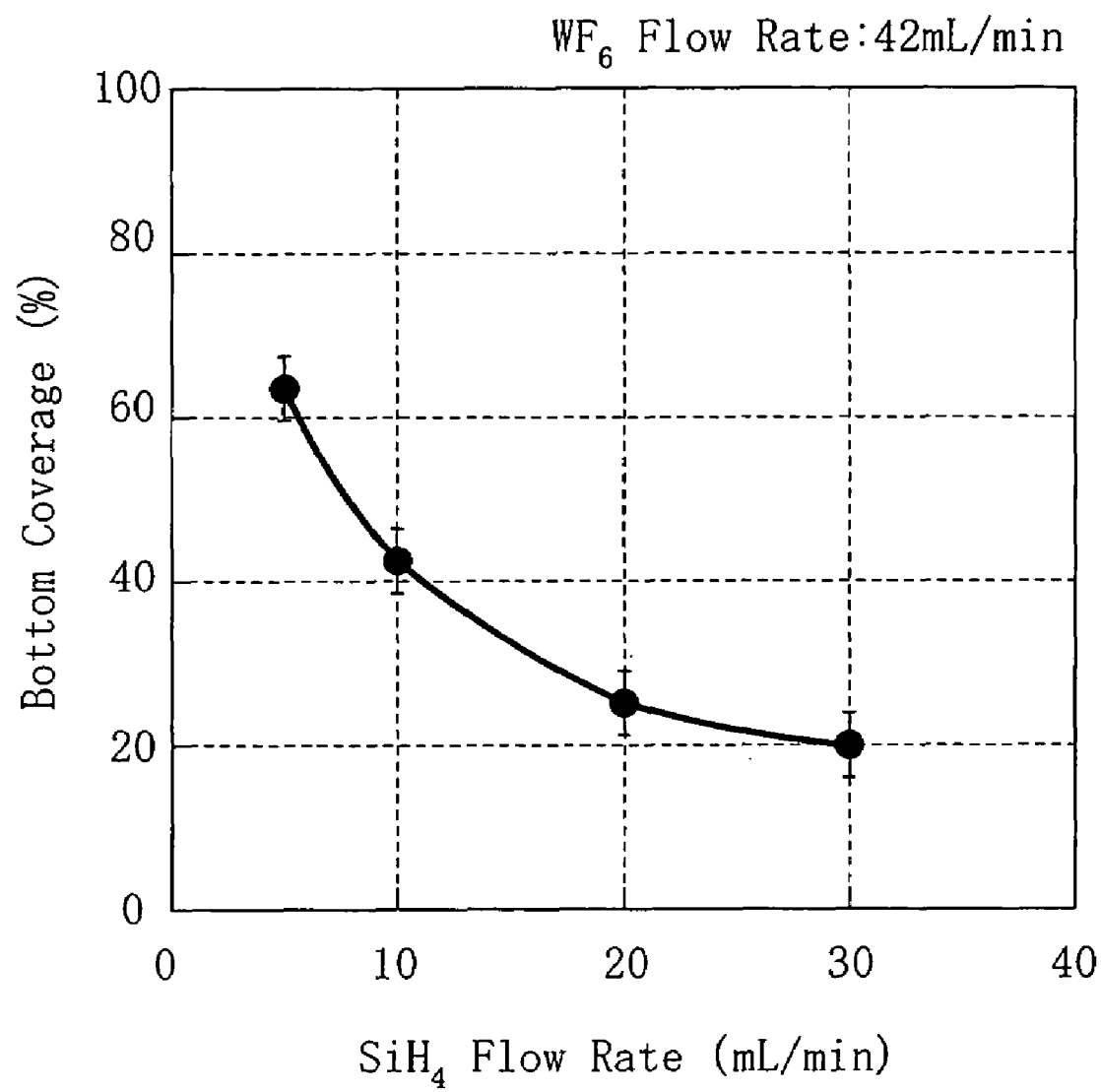
FIG. 6 is a view showing a relationship between the bottom coverage of the first tungsten film and the flow rate of the silicon hydride gas used to form the first tungsten film in the method for fabricating the semiconductor device according to the embodiment.

FIG. 6 shows the result of measuring a relationship between the bottom coverage of the first tungsten film 15 and the flow rate of the silicon hydride gas composing the first raw material gas in the method for fabricating the semiconductor device according to the present embodiment. In FIG. 6, the abscissa represents the flow rate of the silicon hydride gas and the ordinate represents the bottom coverage of the first tungsten film 15. Here, the bottom coverage indicates the ratio of the thickness of the portion of the first tungsten film 15 covering the bottom surface of the contact hole 12a to the thickness of the portion of the first tungsten film 15 located outside the contact hole 12a. Each of the data sets shown in FIG. 6 was obtained from the measurement performed by fixing the flow rate of the tungsten fluoride gas composing the first raw material gas to about 42 mL/min (standard conditions).

As shown in FIG. 6, the bottom coverage of the first tungsten film 15 increases as the flow rate of the silicon hydride gas decreases. When the flow rate of the silicon hydride gas is about 5 mL/min (standard conditions), in particular, the bottom coverage of the first tungsten film 15 increases up to about 63%. As is obvious from FIG. 6, the flow rate of the silicon hydride gas composing the first raw material gas is preferably 5 mL/min (standard conditions) or less. The arrangement improves the bottom coverage of the first tungsten film 15. In other words, the overhang of the first tungsten film 15 at the opening portion of the contact hole 12a can be prevented and the second tungsten film 16 can be formed with excellent morphology on the first tungsten film 15.

By thus setting the flow rate of the silicon hydride gas composing the first raw material gas used to form the first tungsten film 15 to about 5 mL/min (standard conditions) when the flow rate of the tungsten fluoride gas composing the first raw material gas is about 42 mL/min (standard conditions), i.e., by setting the flow rate ratio of the tungsten fluoride gas to the silicon hydride gas to 8.4, the present embodiment allows the formation of the first tungsten film 15 under conditions within a reaction-rate determined range. As a result, the first tungsten film 15 with excellent coverage can be formed.

It will easily be appreciated that the respective flow rates of the tungsten fluoride gas and the silicon hydride gas are not limited to about 42 mL/min and about 5 mL/min (standard conditions) in the step of forming the first tungsten film 15. For example, the flow rate of the tungsten fluoride gas may be 42 mL/min (standard conditions) or more and the flow rate of the silicon hydride gas may be 5 mL/min (standard conditions) or less. In short, the first tungsten film 15 can be formed with excellent coverage provided that the value of the flow rate ratio of the tungsten fluoride gas to the silicon hydride gas is 8.4 or more.

A detailed description will be given next to the result of examining specific conditions in the step of forming the second tungsten film 16 in the method for fabricating the semiconductor device according to the present embodiment with reference to the drawings.

Figure 7:
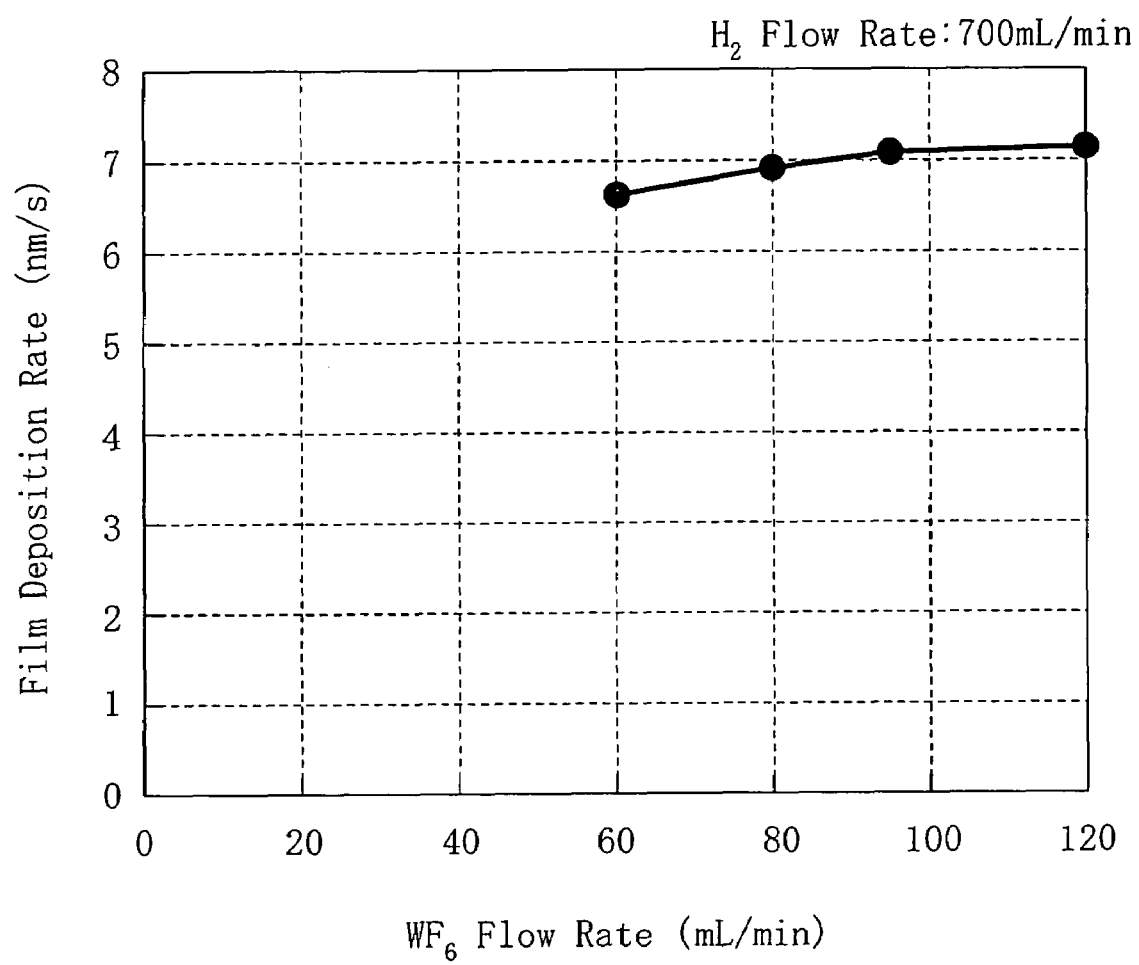
FIG. 7 is a view showing a relationship between the flow rate of a tungsten fluoride gas used to form a second tungsten film and the deposition rate of the second tungsten film in the method for fabricating the semiconductor device according to the embodiment.

FIG. 7 is a graph showing a relationship between the flow rate of the tungsten fluoride gas composing the second raw material gas for forming the second tungsten film 16 and the deposition rate of the second tungsten film 16 in the method for fabricating the semiconductor device according to the present embodiment. In FIG. 7, the abscissa represents the flow rate of the tungsten fluoride gas and the ordinate represents the deposition rate of the second tungsten film 16. Each of the data sets shown in FIG. 7 is obtained from the measurement performed by fixing the flow rate of the hydrogen gas composing the second raw material gas to 700 mL/min (standard conditions).

As shown in FIG. 7, the deposition rate of the second tungsten film 16 increases as the flow rate of the tungsten fluoride gas composing the second raw material gas increases. However, the deposition rate of the second tungsten film 16 barely changes after the flow rate reaches about 120 mL/min (standard conditions). It will therefore be understood that the second tungsten film 16 can be formed in a reaction-rate determined range by setting the flow rate of the tungsten fluoride gas composing the second raw material gas to about 120 mL/min (standard conditions) or more.

Figure 8A:
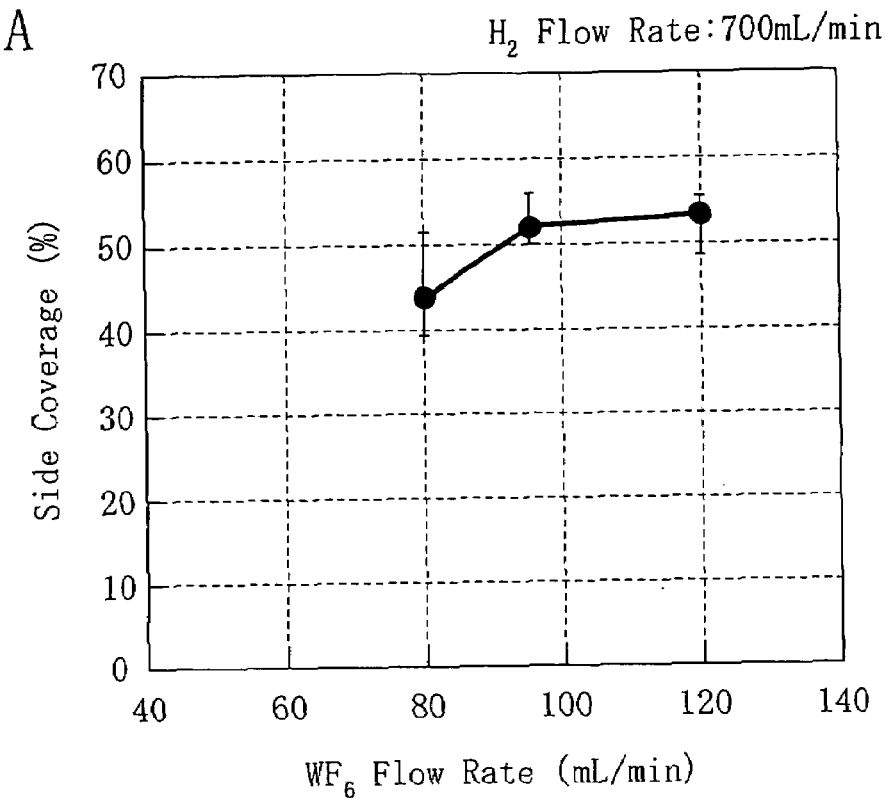
FIG. 8A is a view showing a relationship between the side coverage of the second tungsten film and the flow rate of the tungsten fluoride gas used to form the second tungsten film in the method for fabricating the semiconductor device according to the embodiment and FIG. 8B is a view showing a relationship between the side coverage of the second tungsten film and the flow rate of a hydrogen gas used to form the second tungsten film in the method for fabricating the semiconductor device according to the embodiment.
Figure 8B:
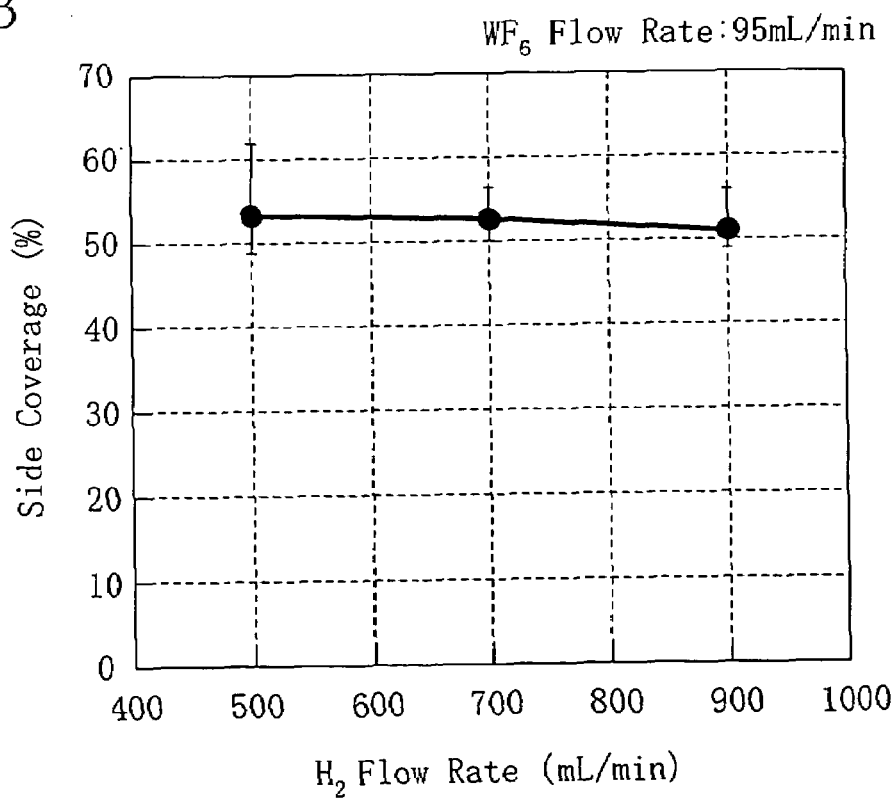
Figure 9:
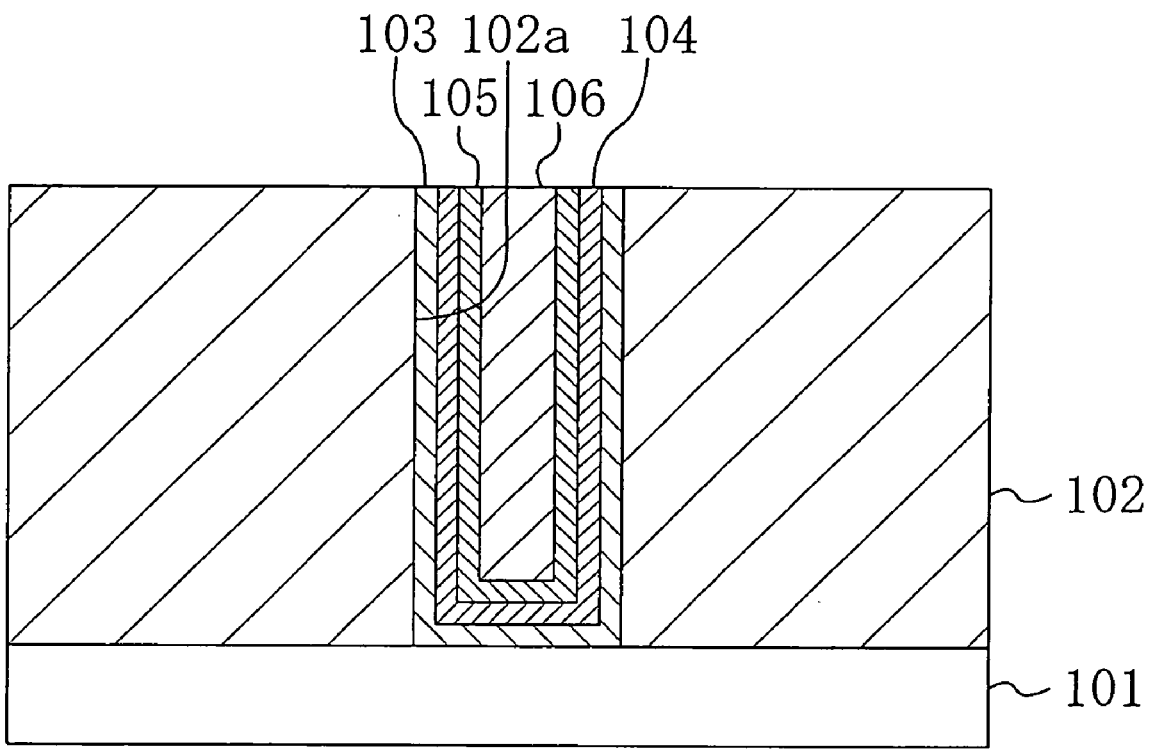
FIG. 9 is a cross-sectional view of a conventional semiconductor device.
Figure 10:
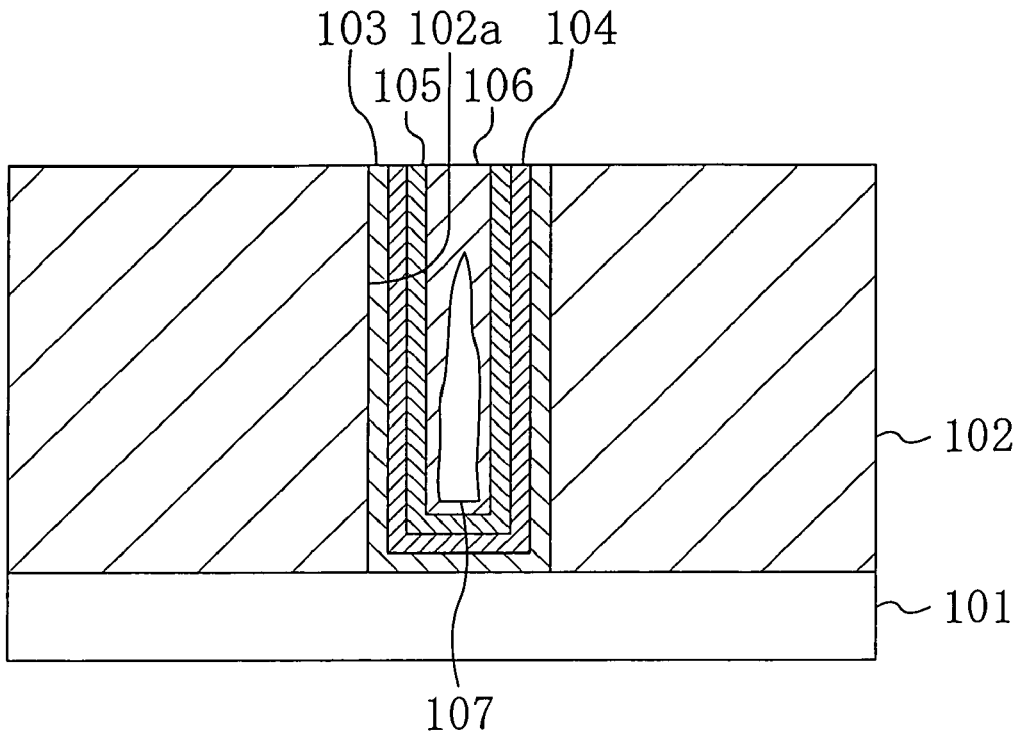
FIG. 10 is a view for illustrating a problem encountered by a method for fabricating the conventional semiconductor device.
Figure 11:
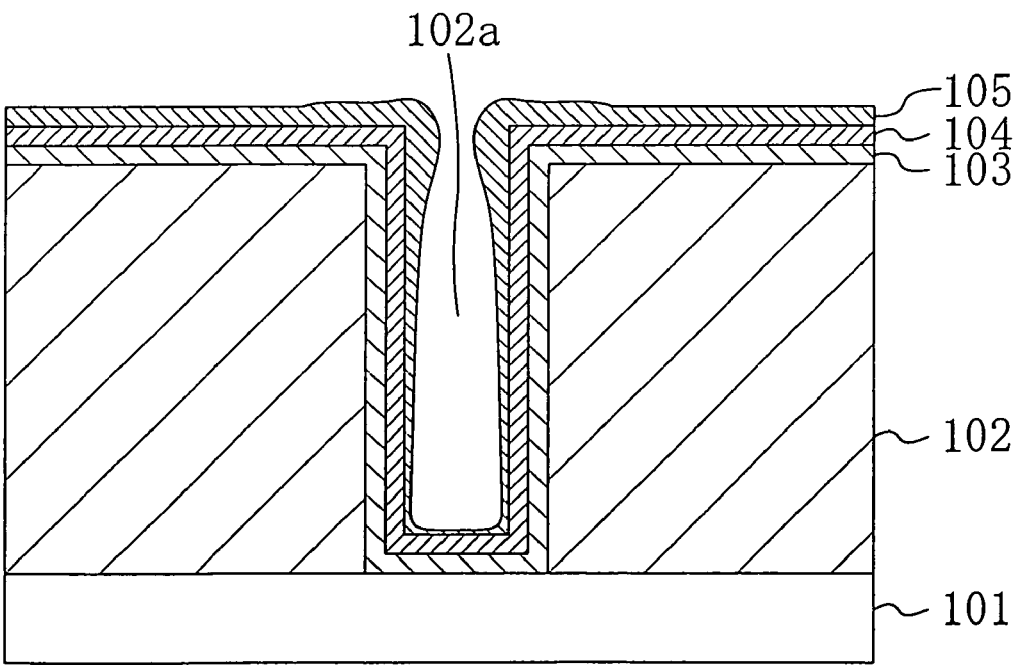
FIG. 11 is a view for illustrating the result of the examination, performed by the present inventors, of the problem of the method for fabricating the conventional semiconductor device.

FIGS. 8A and 8B show a relationship between the flow rate of the second raw material gas for forming the second tungsten film 16, i.e., the respective flow rates of the tungsten fluoride gas and the hydrogen gas and the side coverage of the formed second tungsten film 16 in the contact hole 12a in the method for fabricating the semiconductor device according to the present embodiment, of which FIG. 8A shows a relationship between the flow rate of the tungsten fluoride gas and the side coverage and FIG. 8B shows a relationship between the flow rate of the hydrogen gas and the side coverage. In FIG. 8A, the abscissa represents the flow rate of the tungsten fluoride gas and the ordinate represents the side coverage of the second tungsten film 16. In FIG. 8B, the abscissa represents the flow rate of the hydrogen gas and the ordinate represents the side coverage of the second tungsten film 16. The side coverage used herein indicates the ratio of the thickness of the portion of the second tungsten film 16 covering the wall surface (side surface) of the contact hole 12a to the thickness of the portion of the second tungsten film 16 located outside the contact hole 12a. Each of the data sets shown in FIG. 8A is obtained from the measurement performed by fixing the flow rate of the hydrogen gas composing the second raw material gas to about 700 mL/min (standard conditions). Each of the data sets shown in FIG. 8B is obtained from the measurement performed by fixing the flow rate of the tungsten fluoride gas composing the second raw material gas to 95 mL/min (standard conditions).

As shown in FIG. 8A, when the flow rate of the hydrogen gas is fixed, the side coverage of the second tungsten film 16 improves as the flow rate of the tungsten fluoride is increased gradually from 80 mL/min (standard conditions) and a reaction-rate determined state is substantially reached when the flow rate of the tungsten fluoride becomes 120 mL/min (standard conditions).

As shown in FIG. 8B, when the flow rate of the tungsten fluoride is fixed, the side coverage of the second tungsten film 16 improves as the flow rate of the hydrogen gas is reduced gradually from about 900 mL/min (standard conditions) and a reaction-rate determined state is substantially reached when the flow rate of the hydrogen gas becomes 500 mL/min (standard conditions).

In the present embodiment, therefore, the second tungsten film 16 can be formed under film deposition conditions within a reaction-rate determined range by using the tungsten fluoride at a flow rate of about 120 mL/min (standard conditions) and a hydrogen gas at a flow rate of about 500 mL/min (standard conditions) as the second raw material gas used to form the second tungsten film 16, i.e., by setting the flow rate ratio of the tungsten fluoride gas to the hydrogen gas to 0.24. This allows the formation of the second tungsten film 16 with excellent morphology.

It will easily be appreciated that the respective flow rates of the tungsten fluoride gas and the hydrogen gas are not limited to about 120 mL/min (standard conditions) and about 500 mL (standard conditions) in the step of forming the second tungsten film 16. As described above with reference to FIGS. 7, 8A, and 8B, the flow rate of the tungsten fluoride gas may be, e.g., about 120 mL/min (standard conditions) or more and the flow rate of the hydrogen gas may be, e.g., 500 mL/min (standard conditions) or less. In short, the second tungsten film 16 with excellent morphology can be formed provided that the flow rate ratio of the tungsten fluoride gas to the hydrogen gas is 0.24 or more.

It is to be noted that, in the present embodiment, the heat treatment step performed with respect to the titanium nitride film 14 as the underlie of the first tungsten film 15 prior to the formation of the first tungsten film 15 is not mandatory. The heat treatment step may also be omitted so long as the first tungsten film 15 can be formed such that the average value of the grain size becomes 30 nm or less even at the bottom surface of the contact hole 12a. To achieve this, the first tungsten film 15 may be formed appropriately in the state in which the surface of the titanium nitride film 14 has been cleaned. Accordingly, the surface of the titanium nitride film 14 may also be cleaned by a method other than the heat treatment after the formation of the titanium nitride film 14. Alternatively, it is also possible to, e.g., form the first tungsten film 15 immediately after the formation of the titanium nitride film 14. This allows the formation of the first tungsten film 15 before the surface of the titanium nitride film 14 is degraded or contaminated and thereby suppresses the average value of the grain size of the portion of the first tungsten film 15 formed on the bottom surface of the contact hole 12a to 30 nm or less.

Although the present embodiment has performed the heat treatment using the heat treatment gas composed of the gas mixture of the argon gas and the hydrogen gas with respect to the adhesion layer composed of the multilayer film of the titanium film 13 and the titanium nitride film 14, it is also possible to use, as an adhesion layer, a single titanium nitride film, a tantalum nitride film, a tungsten nitride film, or the like instead of the multilayer film of the titanium film 13 and the titanium nitride film 14. The heat treatment gas is not limited to the gas mixture of the argon gas and the hydrogen gas. Instead, a gas having a reducing or non-oxidizing property may be used as a heat treatment gas. The arrangement ensures, even when the heat treatment temperature is set as high as about 450° C., the removal of contamination or the like that has occurred on the surface of the adhesion layer, while preventing the oxidation of the surface of the semiconductor device, specifically the surface of the adhesion layer, so that the performance of the semiconductor device is no more degraded by the heat treatment. It will easily be understood that the heat treatment may also be performed with respect to the adhesion layer by other methods without using the heat treatment gas.

Although the present embodiment has performed the step of performing the heat treatment with respect to the titanium nitride film 14, i.e., the adhesion layer and the step of forming the tungsten films (the first tungsten film 15 and the second tungsten film 16) in the same reaction chamber, the two steps may also be performed individually in different reaction chambers.

Although the present embodiment has described the formation of the tungsten plug in the contact hole connected to the semiconductor element thereon by way of example, the same effects are achievable even if the present invention is applied to the formation of a tungsten plug in a hole having another function such as, e.g., a via hole connected to a wire thereon.

Although the specific description has been given thus far to the embodiment of the invention achieved by the present inventors, the present invention is not limited thereto. It will easily be appreciated that various modifications and changes can be made without departing from the gist of the invention. That is, in spite of the present embodiment that has described the case where the present invention is applied to the method for fabricating a semiconductor integrated circuit, the present invention is applicable to all methods for fabricating semiconductor integrated circuits involving an electrode forming process using tungsten.

What is claimed is:

1. A semiconductor device comprising a tungsten plug buried in a hole provided in an insulating film,
   a portion of the tungsten plug which is formed on a bottom surface of the hole includes crystal grains having a columnar structure,
   an average value of diameters of the crystal grains of a bottom portion of the columnar structure being 30 nm or less.

2. The semiconductor device of claim 1, wherein an adhesion layer is provided between the insulating film and the tungsten plug.

3. The semiconductor device of claim 2, wherein the adhesion layer is a multilayer film composed of a titanium film and a titanium nitride film which are stacked successively in layers.

4. The semiconductor device of claim 1, wherein the hole has an opening diameter of 0.18 μm or less.

* * * * *

UNITED STATES PATENT AND TRADEMARK OFFICE
CERTIFICATE OF CORRECTION

| | |
|---|---|
| PATENT NO. | : 7,233,073 B2 |
| APPLICATION NO. | : 10/830134 |
| DATED | : June 19, 2007 |
| INVENTOR(S) | : Atsushi Nishimura et al. |

Page 1 of 1

It is certified that error appears in the above-identified patent and that said Letters Patent is hereby corrected as shown below:

On the title page

Under item "(56) References Cited, FOREIGN PATENT DOCUMENTS", add
-- JP 10-032248  2/1998 --

Signed and Sealed this

Sixth Day of November, 2007

JON W. DUDAS
*Director of the United States Patent and Trademark Office*